(12) United States Patent
Bleckmann et al.

(10) Patent No.: US 10,340,102 B2
(45) Date of Patent: Jul. 2, 2019

(54) DEVICE FOR CONTROLLING MULTIPLE FUNCTIONS IN A MOTOR VEHICLE

(71) Applicant: Leopold Kostal GmbH & Co. KG, Luedenscheid (DE)

(72) Inventors: Michael Bleckmann, Schwerte-Ergste (DE); Uwe Borgmann, Recklinghausen (DE)

(73) Assignee: Leopold Kostal GmbH & Co. KG, Luedenscheid (DE)

( * ) Notice: Subject to any disclaimer, the term of this patent is extended or adjusted under 35 U.S.C. 154(b) by 434 days.

(21) Appl. No.: 15/366,031

(22) Filed: Dec. 1, 2016

(65) Prior Publication Data

US 2017/0133177 A1    May 11, 2017

Related U.S. Application Data

(63) Continuation of application No. PCT/EP2015/062166, filed on Jun. 1, 2015.

(30) Foreign Application Priority Data

Jun. 6, 2014    (DE) .......................... 10 2014 008 459
Jun. 6, 2014    (DE) .......................... 10 2014 008 464

(51) Int. Cl.
*G09G 5/00*      (2006.01)
*H01H 21/22*     (2006.01)
(Continued)

(52) U.S. Cl.
CPC ............ *H01H 21/22* (2013.01); *H01H 51/27* (2013.01); *H02K 33/02* (2013.01); *H03K 17/965* (2013.01);
(Continued)

(58) Field of Classification Search
CPC ......................... G06F 3/016; H01H 2003/008
(Continued)

(56) References Cited

U.S. PATENT DOCUMENTS 6,300,936 B1 * 10/2001 Braun .................... G05B 19/00
                                                    345/156
8,072,317 B2    12/2011 Sproelich et al.
(Continued)

FOREIGN PATENT DOCUMENTS

CN        1628317 A      6/2005
DE    102007054347 B3    2/2009
(Continued)

OTHER PUBLICATIONS

The International Bureau of WIPO, International Preliminary Report on Patentability for International Application No. PCT/EP2015/062166 dated Dec. 15, 2016.
(Continued)

*Primary Examiner* — Alexander Talpalatski
(74) *Attorney, Agent, or Firm* — Brooks Kushman P.C.

(57) ABSTRACT

A device for controlling multiple functions includes a switch panel. The switch panel includes control panels extending along a longitudinal extension of the switch panel. The switch panel is pivotably mounted about an axis of rotation parallel with the longitudinal extension to pivot about the axis of rotation in response to manual actuation of the switch panel by manual actuation of the control panels. The switch panel is movable with respect to the longitudinal extension of the switch panel and is fixed with respect to a transverse extension of the switch panel perpendicular to the longitudinal extension. Force sensors respectively associated with the control panels are distributed along the longitudinal extension of the switch panel. Actuation of the switch panel by actuating one of the control panels triggers a function
(Continued)

depending on which one control panel is actuated and the force sensors detect which control panel is actuated.

17 Claims, 3 Drawing Sheets

(51) Int. Cl.
| | |
|---|---|
| H03K 17/967 | (2006.01) |
| H03K 17/98 | (2006.01) |
| H01H 51/27 | (2006.01) |
| H02K 33/02 | (2006.01) |
| H03K 17/965 | (2006.01) |
| H03K 17/975 | (2006.01) |

(52) U.S. Cl.
 CPC ......... *H03K 17/967* (2013.01); *H03K 17/975* (2013.01); *H03K 17/98* (2013.01); *H01H 2021/225* (2013.01); *H03K 2217/96062* (2013.01)

(58) Field of Classification Search
 USPC .......................................................... 335/2
 See application file for complete search history.

(56) References Cited

U.S. PATENT DOCUMENTS

| | | | |
|---|---|---|---|
| 8,314,780 | B2 | 11/2012 | Lin et al. |
| 9,193,265 | B2 | 11/2015 | Schneider et al. |
| 9,268,402 | B2 | 2/2016 | Kern et al. |
| 9,592,735 | B2 * | 3/2017 | Marquas ................. G05G 1/02 |
| 10,032,579 | B2 * | 7/2018 | Brudzynsky ......... H01H 23/006 |
| 10,232,714 | B2 * | 3/2019 | Wachinger ............. B60K 37/06 |
| 2004/0160414 | A1 * | 8/2004 | Armstrong ............ G06F 3/0338 |
| | | | 345/156 |
| 2004/0233159 | A1 | 11/2004 | Badameh |
| 2010/0013614 | A1 | 1/2010 | Sproelich et al. |
| 2011/0122072 | A1 | 5/2011 | Lin et al. |
| 2013/0257776 | A1 * | 10/2013 | Tissot ...................... G05G 5/06 |
| | | | 345/173 |
| 2014/0197938 | A1 | 7/2014 | Kern et al. |
| 2014/0339849 | A1 | 11/2014 | Schneider et al. |
| 2015/0291034 | A1 * | 10/2015 | Marquas .................. G05G 1/02 |
| | | | 74/491 |
| 2018/0194229 | A1 * | 7/2018 | Wachinger ............. B60K 37/06 |

FOREIGN PATENT DOCUMENTS

| | | |
|---|---|---|
| DE | 102009033282 A1 | 4/2010 |
| DE | 102010024776 A1 | 12/2011 |
| DE | 102011111543 A1 | 2/2013 |
| DE | 102011118723 A1 | 5/2013 |
| DE | 102012221107 B3 | 5/2014 |
| TW | 379794 M | 5/2010 |
| WO | 2012055564 A1 | 5/2012 |
| WO | 2012168326 A1 | 12/2012 |
| WO | 2013153048 A1 | 10/2013 |

OTHER PUBLICATIONS

European Patent Office, International Search Report for the corresponding International Application No. PCT/EP2015/062166 dated Nov. 5, 2015.
German Patent Office, German Search Report for the corresponding German Patent Application No. 10 2014 008 459.0 dated Mar. 26, 2015.
German Patent Office, German Search Report for the corresponding German Patent Application No. 10 2014 008 464.7 dated Mar. 26, 2015.
The State Intellectual Property Office of People's Republic of China, The First Office Action for corresponding Chinese Patent Application No. 201580029728.X dated Aug. 1, 2018.
Chinese Patent Office, Chinese Search Report for Chinese Patent Application No. 201580029728X dated Jul. 20, 2018.

* cited by examiner

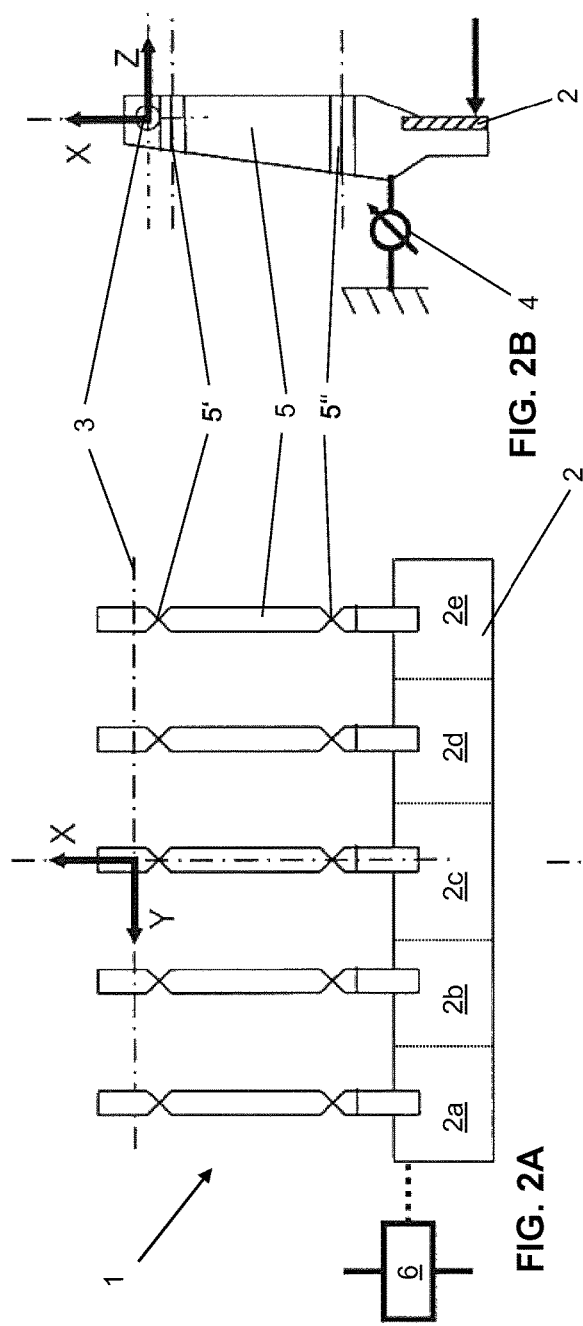

DEVICE FOR CONTROLLING MULTIPLE FUNCTIONS IN A MOTOR VEHICLE

CROSS-REFERENCE TO RELATED APPLICATIONS

This application is a continuation of International Application No. PCT/EP2015/062166, published in German, with an International filing date of Jun. 1, 2015, which claims priority to DE 10 2014 008 459.0, filed Jun. 6, 2014, and DE 10 2014 008 464.7, filed Jun. 6, 2014; the disclosures of which are hereby incorporated in their entirety by reference herein.

TECHNICAL FIELD

The present invention relates to a device for controlling multiple functions in a vehicle, the device including a switch panel that has multiple control panels and is pivotably mounted about a rotation axis, wherein manual actuation of the switch panel to pivot about the rotation axis by manually actuating a control panel triggers one of different functions depending on which of the control panels is actuated, the device further including means for detecting on which of the control panels the switch panel is actuated.

BACKGROUND

DE 10 2010 024 776 A1 describes this type of device. In one embodiment, the device includes a switch panel having multiple control panels. The switch panel is mounted so as to be pivotable about a rotation axis. The switch panel has multiple capacitive sensor surfaces for detecting on which of the control panels the switch panel is actuated. Switching modules or contacts may be actuated by pivoting the switch panel thereby triggering switching functions.

DE 10 2010 024 776 A1 thus describes the functional principle of a device combining touch-sensitive and pressure-actuatable contacting switching elements. Toggle switches in particular are proposed as the switching elements. Actuation of toggle switches requires an actuating travel clearly perceivable haptically. The actuating travel is further increased via the control element, which acts in the manner of a lever. Such additional actuating travel is not desirable in every case. Furthermore, the use of capacitive sensor surfaces results in limitations concerning the selection of materials for the switch panel. Thus, in particular metallic or metal-plated materials cannot be used.

SUMMARY

An object is a device having the advantage over the above-described Background Art in that the switch panel may use metallic or metal-plated materials and requires relatively little contact travel.

In carrying out at least one of the above and/or other objects, a device for controlling multiple functions is provided. The device includes a switch panel having a plurality of control panels extending along a longitudinal extension of the switch panel. The switch panel is pivotably mounted about an axis of rotation that is parallel with the longitudinal extension of the switch panel to pivot about the axis of rotation in response to manual actuation of the switch panel by manual actuation of one or more of the control panels. The switch panel is movable with respect to the longitudinal extension of the switch panel and is fixed with respect to a transverse extension of the switch panel perpendicular to the longitudinal extension of the switch panel. The device further includes a plurality of force sensors distributed along the longitudinal extension of the switch panel and respectively associated with the control panels. Actuation of the switch panel by actuating one of the control panels triggers one of a plurality of different functions depending on which one of the control panels is actuated and the force sensors are configured to detect which one of the control panels is actuated.

An embodiment provides a device for controlling multiple functions in a motor vehicle. The device includes a switch panel. The switch panel has a plurality of control panels. The switch panel is pivotally mounted about an axis of rotation. Manual actuation of the switch panel causes the switch panel to pivot about the rotation axis. The switch panel is manually actuated by manually actuating one or more of the control panels. Actuation of the switch panel by actuating a control panel triggers one of a plurality of different functions depending on which control panel is actuated.

The device further includes a plurality of force transducers or sensors respectively associated with the control panels. The force sensors detect on which of the control panels the switch panel is actuated (i.e., detect or recognize which control panel is actuated). The switch panel is flexible in the direction of its longitudinal extension (i.e., its length) and is rigid in the direction of its transverse extension (i.e., its width) perpendicular thereto. The control panels extend along the longitudinal extension of the switch panel. The force sensors are distributed along the longitudinal extension of the switch panel in being respectively associated with the control panels.

In terms of the X-Y-Z frame of reference, the axis of rotation is aligned in the Y-direction. The switch panel is pivotable in the Z-direction about the axis of rotation. The longitudinal extension of the switch panel extends along the Y-direction. As such, the control panels extend along the Y-direction. Correspondingly, the force sensors are distributed along the Y-direction to be respectively associated with the control panels. As the switch panel is flexible in the direction of its longitudinal extension and is rigid in its transverse direction, the switch panel is flexible in the Y-direction and is rigid in the X-direction.

In embodiments, the switch panel is flexible with respect to its longitudinal extension and is rigid with respect to its transverse extension and multiple force sensors associated with the switch panel are distributed along the longitudinal extension of the switch panel.

In an embodiment, the switch panel includes a flat, inherently flexible actuating plate and a plurality of reinforcing ribs connected to the actuating plate. The actuating plate extends along the longitudinal extension of the switch panel and includes the control panels. The reinforcing ribs are respectively connected to the actuating plate at locations corresponding to the control panels. In this way, the reinforcing ribs are respectively associated with the control panels. As such, the amount of control panels and the amount of reinforcing ribs are the same.

The reinforcing ribs extend between the actuating plate and the rotation axis along the transverse extension of the switch panel. The ends of the reinforcing ribs facing away from the connections with the actuating plate encompass the rotation axis. The reinforcing ribs create the flexural rigidity in the transverse extension of the switch panel.

In an embodiment, the force sensors support the torque applied about the rotation axis when the switch panel is actuated. The force sensors are also used for determining a force profile that is generated, due to the flexibility of the switch panel with respect to its longitudinal extension, when the switch panel is actuated. The force profile is used for detecting on which of the control panels the switch panel is actuated.

In an embodiment, the device further includes means for generating haptic feedback. The haptic feedback means generate haptic feedback when the switch panel is actuated. In one form, the haptic feedback means is an electromagnetic actuator. The electromagnetic actuator is situated in such a way to controllable cause the actuating plate of the switch panel to undergo displacement in parallel to the rotation axis (i.e., in a direction along the longitudinal extension of the switch panel or along the Y-direction). In particular, the electromagnetic actuator is situated to displace the actuating plate in one direction in parallel to the rotation axis (i.e., in one direction along the longitudinal extension of the switch panel) when the switch panel is actuated. Correspondingly, the electromagnetic actuator is situated to displace the actuating plate in the opposite direction in parallel to the rotation axis (i.e., in the opposite direction along the longitudinal extension of the switch panel) to thereby return the switch panel back to its original position along the longitudinal extension of the switch panel when the actuation of the switch panel is removed.

In an embodiment, the displacement of the actuating plate along the longitudinal extension of the switch panel (i.e., along the Y-direction) is facilitated, for example, by the switch panel being made essentially of plastic and the reinforcing ribs being provided in each case with two articulated joints. The articulated joints may be film hinges. The articulated joints allow movements of the reinforcing ribs about axes that are parallel to the direction of actuation of the switch panel (i.e., allow movements of the reinforcing ribs in the Z-direction).

In a particularly compact embodiment, the electromagnetic actuator includes an electric magnetic clamp. The electric magnetic clamp is fixedly mounted with respect to the switch panel. The electric magnetic clamp cooperates with a ferromagnetic element that is fixedly connected to the switch panel. The electric magnetic clamp is preferably connected to the ferromagnetic element with a force fit with a nonmagnetic elastic element situated in between. The nonmagnetic elastic element may be made, for example, of rubber, silicone, thermoplastic elastomer, or similar material.

In embodiments, the force sensors may be, for example, disk-shaped sensors which operate according to a capacitive functional principle. Such sensors include parallel capacitor disks, for example, which may have relatively small dimensions. In particular, such sensors may have relatively small dimensions in the actuating direction and may detect forces over a short actuating travel distance. Alternatively, the force sensors may be piezoelectric sensors.

BRIEF DESCRIPTION OF THE DRAWINGS

FIG. 2A is a schematic illustration of a top view of a switch panel of a device for controlling multiple functions in accordance with another embodiment of the present invention, the device including an electromagnetic actuator configured to displace the switch panel along the longitudinal extension of the switch panel, the switch panel being in a non-displaced position along the longitudinal extension of the switch panel;

FIG. 2B is a schematic illustration of a side view of the switch panel shown in FIG. 2A;

FIG. 2C is a schematic illustration of a top view of the switch panel, the switch panel being in a displaced position along the longitudinal extension of the switch panel by the electromagnetic actuator.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figures 1A, 1B:
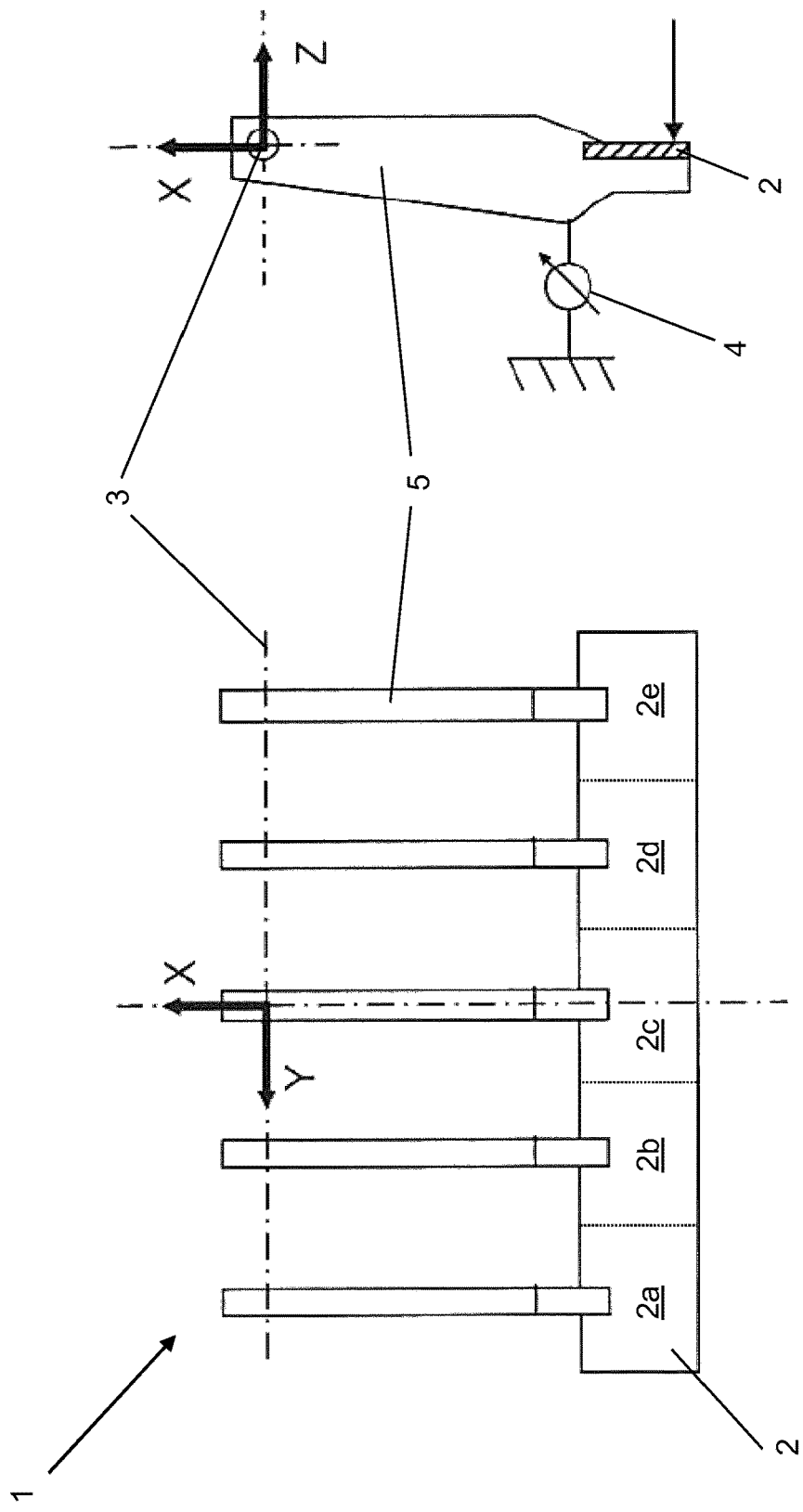
FIG. 1A is a schematic illustration of a top view of a switch panel of a device for controlling multiple functions in accordance with an embodiment of the present invention.
FIG. 1B is a schematic illustration of a side view of the switch panel, including the association of a force sensor with a control panel of the switch panel.

Referring now to FIGS. 1A and 1B, a switch panel 1 of a device for controlling multiple functions such as in a motor vehicle in accordance with an embodiment of the present invention will be described. FIG. 1A is a schematic illustration of a top view of switch panel 1. FIG. 1B is a schematic illustration of a side view of the switch panel.

Switch panel 1 includes an actuating plate 2. Actuating plate 2 includes a plurality of control panels 2a, 2b, 2c, 2d, 2e. Switch panel 1 is pivotally mounted about an axis of rotation 3. Manual actuation of switch panel 1 causes the switch panel to pivot about the rotation axis. Switch panel 1 is manually actuated by manually actuating one or more of control panels 2a, 2b, 2c, 2d, 2e. Manual actuation of switch panel 1 by manually actuating a control panel 2a, 2b, 2c, 2d, 2e triggers one of a plurality of different functions depending on which of the control panels 2a, 2b, 2c, 2d, 2e is actuated.

The device further includes a plurality of force transducers (or "sensors") 4. Force sensors 4 are respectively associated with control panels 2a, 2b, 2c, 2d, 2e. FIG. 1B illustrates the association of a force sensor 4 with a control panel. Force sensors 4 detect which control panel 2a, 2b, 2c, 2d, 2e is actuated in actuating switch panel 1.

Switch panel 1 is flexible in the direction of its longitudinal extension (i.e., its length). The direction of the longitudinal extension of switch panel extends along the Y-direction shown in FIG. 1A. Switch panel 1 is rigid in the direction of its transverse extension (i.e., its width) perpendicular thereto. The direction of the transverse extension of switch panel 1 extends along the X-direction shown in FIGS. 1A and 1B. As such, switch panel 1 is flexible in the Y-direction and is rigid in the X-direction.

As shown in FIGS. 1A and 1B, axis of rotation 3 is aligned in the Y-direction. As shown in FIG. 1B, switch panel 1 is pivotable in the Z-direction about axis of rotation 3.

Control panels 2a, 2b, 2c, 2d, 2e extend along the longitudinal extension of switch panel 1. Correspondingly, force sensors 4 are distributed along the longitudinal extension of switch panel 1 in being respectively associated with control panels 2a, 2b, 2c, 2d, 2e.

Control panels 2a, 2b, 2c, 2d, 2e are provided for the purpose of controlling multiple functions. Each control panel 2a, 2b, 2c, 2d, 2e is respectively associated with at least one of the controllable functions. In particular, control panels 2a, 2b, 2c, 2d, 2e are respectively associated with the controllable functions in such a way that when switch panel 1 is manually actuated, the functions associated in each case with the control panel 2a, 2b, 2c, 2d, 2e are triggered, depending on which of the control panels 2a, 2b, 2c, 2d, 2e is actuated.

For enabling the actuation, switch panel 1 is mounted so that it is pivotable about rotation axis 3 (also denoted as the Y-axis in FIG. 1A). Switch panel 1 includes a flat, inherently relatively flexible actuating plate 2. Actuating plate 2 includes control panels 2a, 2b, 2c, 2d, 2e. Control panels 2a, 2b, 2c, 2d, 2e are situated on the upper surface (which is shown in FIG. 1A) of actuating plate 2. Actuating plate 2 extends along the longitudinal extension of switch panel 1. In this way, control panels 2a, 2b, 2c, 2d, 2e extend along the longitudinal extension of switch panel 1.

Switch panel 1 further includes a plurality of reinforcing ribs 5. Reinforcing ribs 5 are respectively fixedly connected at one end to actuating plate 2 at locations corresponding to control panels 2a, 2b, 2c, 2d, 2e. Reinforcing ribs 5 extend in parallel along the transverse direction of switch panel 1 (i.e., along the X-direction) between actuating plate 2 and rotation axis 3. The ends of reinforcing ribs 5 facing away from the connection to actuating plate 2 encompass rotation axis 3, about which reinforcing ribs 5 are freely rotatable.

Reinforcing ribs 5 create the flexural rigidity of actuating plate 2 in their transverse extension due to their orientation along the transverse direction of switch panel 1 and their connection to actuating plate 2. As a whole, the described arrangement thus results in switch panel 1 having a design that is flexible with respect to its longitudinal extension and rigid with respect to its transverse extension perpendicular thereto.

Force sensors 4 are distributed along switch panel 1 in the direction of the longitudinal extension of actuating plate 2. Force sensors 4 are arranged such that the force sensors are respectively beneath reinforcing ribs 5 (i.e., beneath each reinforcing rib 5 is a unique force sensor 4). For instance, as shown in FIG. 1B, a force sensor 4 is beneath (in the Z-direction) a reinforcing rib 5. Each force sensor 4 supports a torque that is exerted on the corresponding reinforcing rib 5 during rotation about rotation axis 3 and measures the corresponding force. When force is introduced, in the sense of an actuation, at any given location on actuating plate 2, force sensor 4 situated closest to this location experiences the greatest force. Since actuating plate 2 also has only limited flexibility in its longitudinal extension, adjacent force sensors 4 also experience actuating forces. Such actuating forces experienced by adjacent force sensors 4, however, become smaller with increasing distance from the location of the introduction of force. Thus, based on the distribution or the profile of the measured forces of all force sensors 4 when switch panel 1 is actuated, it is possible not only to establish the actuation as such, but also to determine the location of the introduction of force. The control panel 2a, 2b, 2c, 2d, 2e intended with the actuation is identifiable based on the determination of the location of the introduction of force.

Referring now to FIGS. 2A, 2B, and 2C, with continual reference to FIGS. 1A and 1B, switch panel 1 of the device in accordance with another embodiment of the present invention will be described. Switch panel 1 shown in FIGS. 2A, 2B, and 2C includes a refinement for facilitating movement of switch panel 1 in the direction parallel to rotation axis 3 (i.e., in the Y direction).

The device includes an actuator 6 such as in the form of an electromagnet. Actuator 6 is provided to enable haptic feedback to be achieved by such a movement switch panel 1 in the direction parallel to rotation axis 3. In particular, actuator 6 is configured to actuate switch panel 1 to move in one direction along the Y-direction and to move in the opposite direction along the Y-direction. In this regard, switch panel 1 is illustrated in FIG. 2A as being in a non-displaced position along the Y-direction whereas switch panel 1 is illustrated in FIG. 2C as being in a displaced position along the Y-direction.

The refinement for facilitating movement of switch panel 1 along the Y-direction includes reinforcing ribs 5 being additionally provided in each case with two articulated joints 5', 5". Articulated joints 5', 5" are designed as film hinges. Actuating plate 2 and reinforcing ribs 5 are preferably designed as a one-piece plastic part. Articulated joints 5', 5" are respectively situated in the vicinity of rotation axis 3 and in the vicinity of the connection of reinforcing ribs 5 to actuating plate 2. Articulated joints 5', 5" allow movements of reinforcing ribs 5 about the Z axis. This direction corresponds essentially to the direction of the actuation of switch panel 1.

As is apparent in particular from FIG. 2C, the two articulated joints 5', 5" for each reinforcing rib 5 result in the option to carry out, with the aid of actuator 6, a displacement of actuating plate 2 in the Y-direction, i.e., in parallel to the rotation axis 3, by parallel buckling of all reinforcing ribs 5. The displacement which also occurs at the same time in the X-direction is practically negligible, since the displacement in the Y-direction takes place by only a very small amount.

Figure 3:
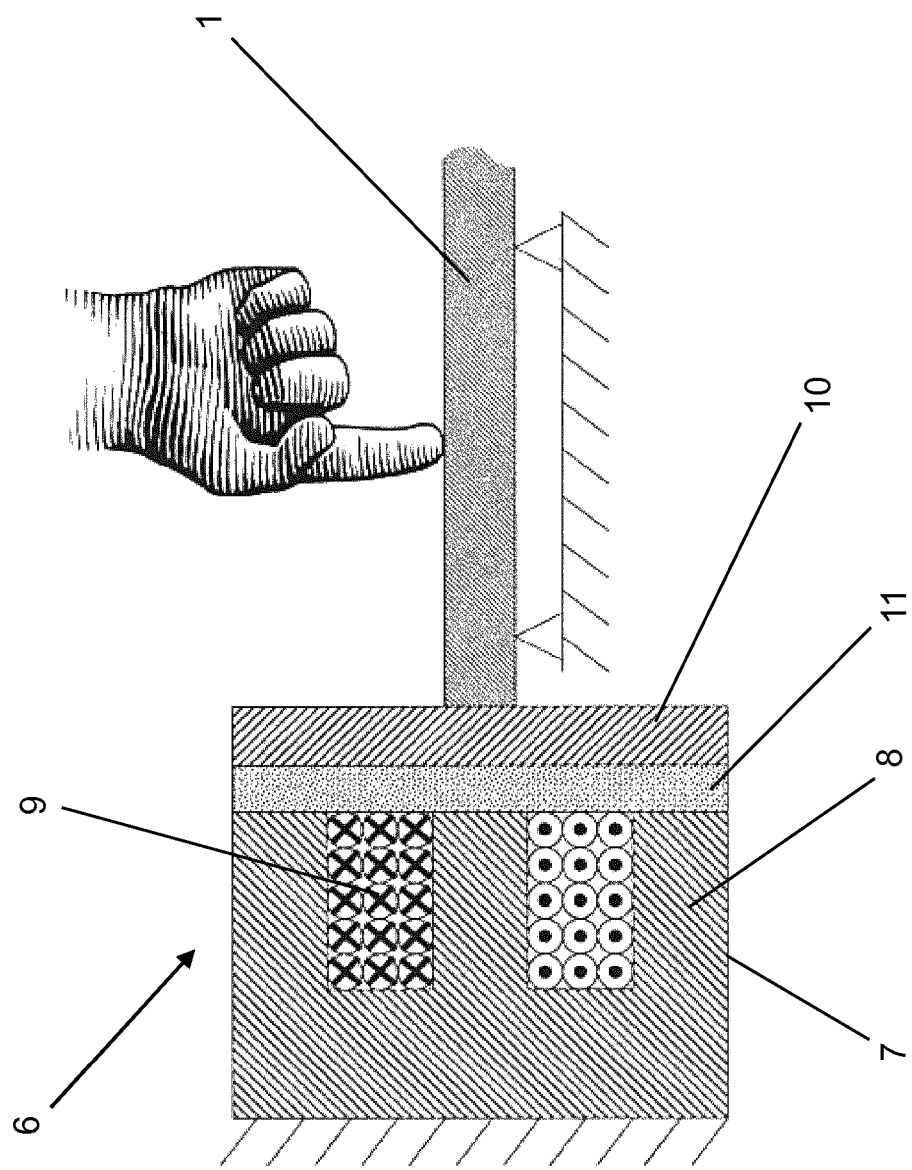
FIG. 3 is a schematic illustration of the switch panel and the electromagnetic actuator shown in FIG. 2A, the electromagnetic actuator being connected to an actuating plate of the switch panel.

Referring now to FIG. 3, an embodiment of electromagnetic actuator 6 which allows a particularly compact design of the overall arrangement will be described. As shown in FIG. 3, electromagnetic actuator 6 is connected to actuating plate 2 of switch panel 1. Electromagnetic actuator 6 includes an electric magnetic clamp 7. Electric magnetic clamp 7 is fixedly mounted with respect to switch panel 1. Electric magnetic clamp 7 includes a ferromagnetic core 8. Ferromagnetic core 8 includes a circular cross section and an E shape in the longitudinal section. A coil 9 made of copper wire is accommodated within the E shape of ferromagnetic core 8. By energization of coil 9, a magnetic field is generated which exerts an attractive force effect on a ferromagnetic element, for example an iron plate 10, situated in the vicinity.

Electric magnetic clamp 7 is connected to iron plate 10 with a non-magnetic elastic plate 11. Non-magnetic elastic plate 11 is situated between electric magnetic clamp 7 and iron plate 10. Non-magnetic elastic plate 11 may be made, for example, of rubber, silicone, thermoplastic elastomer, or similar material. When coil 9 is energized, magnetic clamp 7 attracts iron plate 10 and moves it toward magnetic clamp 7, thus compressing elastic plate 11. When the energization of coil 9 is interrupted, elastic plate 11 relaxes and iron plate 10 is moved back into its original position.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A device for controlling multiple functions, comprising:
a switch panel having at least three control panels extending along a longitudinal extension of the switch panel, the switch panel being pivotably mounted about an axis of rotation that is parallel with the longitudinal extension of the switch panel to pivot about the axis of rotation in response to manual actuation of the switch panel by manual actuation of one or more of the control panels;
wherein the switch panel is movable with respect to the longitudinal extension of the switch panel and is fixed with respect to a transverse extension of the switch panel perpendicular to the longitudinal extension of the switch panel;
the switch panel further including an actuating plate having the control panels, the actuating plate extends along the longitudinal extension of the switch panel;
the switch panel further including at least three reinforcing ribs each being respectively for a respective one of the control panels, the reinforcing ribs are respectively connected to the actuating plate at locations corresponding to the control panels and extend along the transverse extension of the switch panel between the actuating plate and the axis of rotation, the reinforcing ribs are pivotably mounted about the axis of rotation whereby the switch panel is pivotably mounted about the axis of rotation to pivot about the axis of rotation, the reinforcing ribs cause the switch panel to be fixed with respect to the transverse extension of the switch panel;
a plurality of force sensors distributed along the longitudinal extension of the switch panel and respectively associated with the control panels; and
wherein actuation of the switch panel by actuating one of the control panels triggers one of a plurality of different functions depending on which one of the control panels is actuated and the force sensors are configured to detect which one of the control panels is actuated.

2. The device of claim 1 further comprising:
an electromagnetic actuator configured to controllable displace the actuating plate along the longitudinal extension of the switch panel.

3. The device of claim 2 wherein:
the electromagnetic actuator displaces the actuating plate in a first direction along the longitudinal extension of the switch panel when the switch panel is actuated and displaces the actuating plate in an opposite second direction along the longitudinal extension of the switch panel when actuation of the switch panel is removed.

4. The device of claim 2 wherein:
the electromagnetic actuator includes an electric magnetic clamp fixedly mounted with respect to the switch panel, a non-magnetic elastic element, and a ferromagnetic element connected to the actuating plate of the switch panel, the electric magnetic clamp being connected to the ferromagnetic element with the non-magnetic elastic element situated in between the electric magnetic clamp and the ferromagnetic element.

5. The device of claim 4 wherein:
the non-magnetic elastic element includes an elastomeric plastic.

6. The device of claim 1 wherein:
each reinforcing rib includes at least one articulated joint to facilitate the switch panel being movable with respect to the longitudinal extension of the switch panel.

7. The device of claim 1 further comprising:
means for generating haptic feedback when the switch panel is actuated.

8. The device of claim 1 wherein:
the force sensors are configured to generate a force profile when the switch panel is actuated, the force profile being indicative of which one of the control panels is actuated.

9. The device of claim 1 wherein:
the switch panel is plastic.

10. The device of claim 1 wherein:
the force sensors support a torque applied about the axis of rotation when the switch panel is actuated.

11. The device of claim 1 wherein:
the force sensors are disk-shaped sensors which operate according to a capacitive functional principle.

12. The device of claim 1 wherein:
the force sensors are piezoelectric sensors.

13. A device for controlling multiple functions in a vehicle, comprising:
a switch panel having an actuating plate including a plurality of control panels, the actuating plate with the control panels extending along a longitudinal extension of the switch panel, the actuating plate being pivotably mounted about an axis of rotation that is parallel with the longitudinal extension of the switch panel to pivot about the axis of rotation in response to manual actuation of the actuating plate by manual actuation of one or more of the control panels;
wherein the actuating plate is movable with respect to the longitudinal extension of the switch panel and is fixed with respect to a transverse extension of the switch panel perpendicular to the longitudinal extension of the switch panel;
wherein the switch panel further includes a plurality of reinforcing ribs connected to the actuating plate, the reinforcing ribs are respectively connected to the actuating plate at locations corresponding to the control panels and extend along the transverse extension of the switch panel between the actuating plate and the axis of rotation, the reinforcing ribs cause the actuating plate to be fixed with respect to the transverse extension of the switch panel;
wherein each reinforcing rib includes at least one articulated joint to facilitate the actuating panel being movable with respect to the longitudinal extension of the switch panel;
a plurality of force sensors distributed along the longitudinal extension of the switch panel and respectively associated with the control panels; and
wherein actuation of the actuating plate by actuating one of the control panels triggers one of a plurality of different functions depending on which one of the control panels is actuated and the force sensors are configured to detect which one of the control panels is actuated.

14. The device of claim 13 further comprising:
an electromagnetic actuator configured to controllable displace the actuating plate along the longitudinal extension of the switch panel.

15. The device of claim 14 wherein:
the electromagnetic actuator displaces the actuating plate in a first direction along the longitudinal extension of the switch panel when the actuating plate is actuated and displaces the actuating plate in an opposite second direction along the longitudinal extension of the switch panel when actuation of the actuating plate is removed.

16. The device of claim 13 further comprising:
means for generating haptic feedback when the actuating panel is actuated.

17. The device of claim 13 wherein:
the force sensors are configured to generate a force profile when the actuating panel is actuated, the force profile being indicative of which one of the control panels is actuated.

* * * * *